United States Patent
Kim et al.

(10) Patent No.: US 10,847,194 B2
(45) Date of Patent: Nov. 24, 2020

(54) INPUT/OUTPUT CIRCUIT AND MEMORY DEVICE HAVING THE SAME

(71) Applicant: SK hynix Inc., Gyeonggi-do (KR)

(72) Inventors: Dong Hyun Kim, Gyeonggi-do (KR); Dae Han Kwon, Seoul (KR); Kwan Su Shon, Gyeonggi-do (KR); Soon Ku Kang, Gyeonggi-do (KR); Jung Hyun Shin, Seoul (KR); Doo Bock Lee, Seoul (KR); Yo Han Jeong, Gyeonggi-do (KR); Eun Ji Choi, Gyeonggi-do (KR); Tae Jin Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 102 days.

(21) Appl. No.: 16/194,834

(22) Filed: Nov. 19, 2018

(65) Prior Publication Data
US 2019/0287587 A1    Sep. 19, 2019

(30) Foreign Application Priority Data
Mar. 14, 2018    (KR) .................. 10-2018-0029751

(51) Int. Cl.
*G11C 7/10*    (2006.01)
*G11C 7/22*    (2006.01)

(52) U.S. Cl.
CPC ............ *G11C 7/222* (2013.01); *G11C 7/1057* (2013.01); *G11C 7/1084* (2013.01)

(58) Field of Classification Search
CPC ........ G11C 7/02; G11C 7/1057; G11C 7/1084
USPC .................................................... 365/194
See application file for complete search history.

(56) References Cited

U.S. PATENT DOCUMENTS

| 6,292,428 | B1* | 9/2001 | Tomita | G11C 7/1066 |
| | | | | 365/189.05 |
| 2007/0050658 | A1* | 3/2007 | Kuwata | H04L 7/0008 |
| | | | | 713/503 |
| 2008/0126822 | A1* | 5/2008 | Kim | G11C 7/1087 |
| | | | | 713/500 |
| 2011/0043262 | A1* | 2/2011 | Watanabe | H03L 7/0814 |
| | | | | 327/158 |
| 2017/0097655 | A1* | 4/2017 | Jeon | G06F 1/12 |
| 2017/0192913 | A1 | 7/2017 | Hsu et al. | |

FOREIGN PATENT DOCUMENTS

| KR | 1020160060873 | 5/2016 |
| KR | 101659840 | 9/2016 |

* cited by examiner

*Primary Examiner* — Hoai V Ho
*Assistant Examiner* — Minh Dinh
(74) *Attorney, Agent, or Firm* — IP & T Group LLP

(57) ABSTRACT

An input/output circuit includes a data buffer group configured to buffer data received through data lines, a data strobe buffer configured to buffer a data strobe signal to output a buffered data strobe clock, a digitally controlled delay line configured to output delay data by controlling skew of the buffered data according to a delay code, a data strobe clock output circuit configured to generate a delay data strobe clock in response to the buffered data strobe clock, a sampler configured to sample the delay data according to the delay data strobe clock to output sampled data, and a de-skew circuit configured to update the delay code according to the sampled data.

20 Claims, 8 Drawing Sheets

ND MEMORY
INPUT/OUTPUT CIRCUIT AND MEMORY DEVICE HAVING THE SAME

CROSS-REFERENCE TO RELATED APPLICATION

The present application claims priority to Korean patent application number 10-2018-0029751, filed on Mar. 14, 2018, which is incorporated herein by reference in its entirety.

BACKGROUND

1. Field of Invention

Various embodiments of the present invention relate to an input/output circuit. Particularly, the embodiments relate to an input/output circuit capable of reducing a read operation time.

2. Description of Related Art

A memory system may include a storage device and a memory controller.

The storage device may include a plurality of memory devices. The plurality of memory devices may store data or output the stored data. For example, these memory devices may include volatile memory devices that lose stored data when power supply is interrupted, or non-volatile memory devices that retain the stored data even when power supply is interrupted.

The memory controller may control data communication between a host and the storage device.

The host may communicate with the memory devices by using an interface protocol such as Peripheral Component Interconnect-Express (PCI-E), Advanced Technology Attachment (ATA), Serial ATA (SATA), Parallel ATA (PATA), or serial attached SCSI (SAS). However, the interface protocols provided for the purpose of data communication between the host and the memory system may not be limited to the above examples and may include various interface protocols such as a Universal Serial Bus (USB), a Multi-Media Card (MMC) an Enhanced Small Disk Interface (ESDI), or Integrated Drive Electronics (IDE).

SUMMARY

Various embodiments are directed to an input/output circuit capable of improving reliability of input/output data.

According to an embodiment, an input/output circuit including a data buffer group configured to buffer data received through data lines, a data strobe buffer configured to buffer a data strobe signal to output a buffered data strobe clock, a digitally controlled delay line configured to output delay data by controlling skew of the buffered data according to a delay code, a data strobe clock output circuit configured to generate a delay data strobe clock in response to the buffered data strobe clock, a sampler configured to sample the delay data according to the delay data strobe clock to output sampled data, and a de-skew circuit configured to update the delay code according to the sampled data.

According to an embodiment, an input/output circuit including a data path configured to transfer data, a data strobe path configured to transfer a data strobe signal, and a de-skew circuit configured to reduce skew between rising data and falling data output through the data path by feeding back the rising and falling data output through the data path and by controlling a delay time of the data path and the data strobe path.

According to an embodiment, an input/output circuit including a data path configured to generate rising and falling data from input data according to a reference strobe clock, and provide the rising and falling data to a memory core included in the memory device, a data strobe path configured to generate the reference strobe clock from an input data strobe signal, and a de-skew circuit configured to reduce skew between the rising and falling data by controlling delay in the data path and the data strobe path with reference to the rising and falling data provided from the data path.

DETAILED DESCRIPTION

Figure 1:
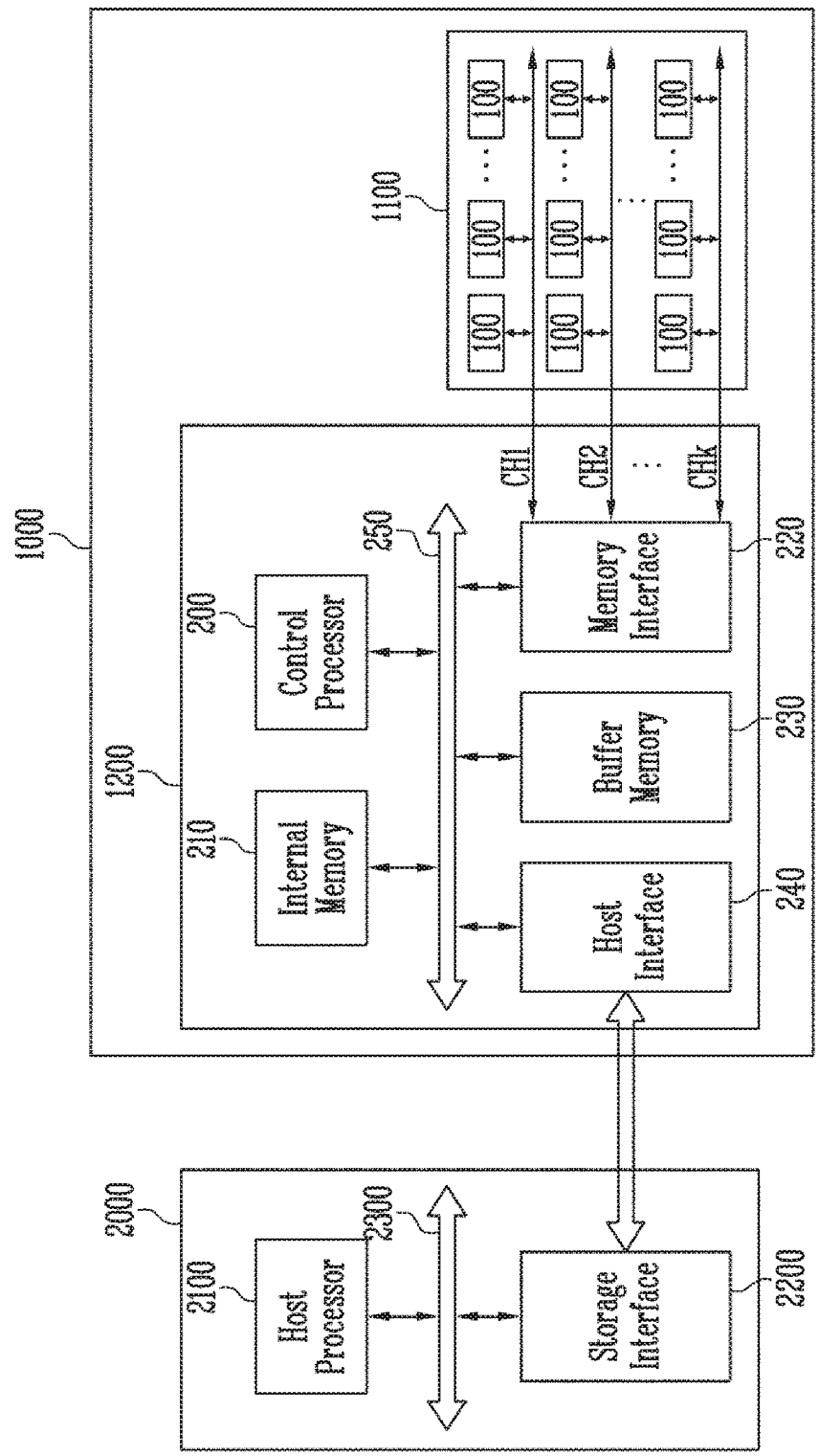
FIG. 1 is a diagram illustrating a memory system according to an embodiment.

Various exemplary embodiments of the present invention will now be described in more detail hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art. It is noted that reference to "an embodiment" does not necessarily mean only one embodiment, and different references to "an embodiment" are not necessarily to the same embodiment(s).

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

The terminology used herein is for the purpose of describing particular embodiments only and is not intended to be limiting of the present invention.

As used herein, singular forms may include the plural forms as well and vice versa, unless the context clearly indicates otherwise.

Hereinafter, exemplary embodiments of the present disclosure will be described in detail with reference to the accompanying drawings in order for those skilled in the art to be able to readily implement the technical spirit of the present disclosure. Moreover, detailed descriptions related to well-known functions or configurations will be ruled out in order not to unnecessarily obscure subject matters of the present invention. In the drawings, like reference numerals refer to like elements throughout.

FIG. 1 is a diagram illustrating a memory system 1000 according to an embodiment.

Referring to FIG. 1, the memory system 1000 may include a storage 1100 and a memory controller 1200 communicating between the storage 1100 and a host 2000.

The storage 1100 may include a plurality of memory devices 100. For example, each of the memory devices 100 may include a volatile memory device that loses the stored data when power supply is interrupted, or a non-volatile memory device that retains the stored data even when power supply is interrupted. FIG. 1 illustrates an embodiment of the memory device 100 composed of a non-volatile memory device. For example, the non-volatile memory device may be a flash memory device.

The memory devices 100 may be coupled to a plurality of channels CH1 to CHk. For example, the plurality of memory devices 100 may be coupled to each of the first to kth channels Ch1 to Chk.

The memory controller 1200 may include a control processor 200, an internal memory 210, a memory interface 220, a buffer memory 230, and a host interface 240.

The control processor 200 may perform various operations to control the storage 1100, or may generate a command or an address. For example, the control processor 200 may generate a status check command for a status check operation to check a status of the storage 1100, and may generate a command for controlling the storage 1100 according to the check result.

The internal memory 210 may store various types of information for operations of the memory controller 1200. For example, the internal memory 210 may include logical and physical address map tables. According to an address map table, when a logical address is input to the internal memory 210, a physical address corresponding to the input logical address may be output. In addition, when a physical address is input to the internal memory 210, a logical address corresponding to the input physical address may be output. For example, the logical address may be input to the internal memory 210 from the host 2000, and the physical address may be input to the internal memory 210 from the storage 1100. The internal memory 210 may include at least one of random access memory (RAM), dynamic RAM (DRAM), static RAM (SRAM), cache, and tightly coupled memory (TCM).

The memory interface 220 may exchange a command, an address, and data between the memory controller 1200 and the storage 1100. For example, the memory interface 220 may transfer a command, an address, and data to the memory devices 100 and may receive data from the memory device 100 through the first to the kth channels CH1 to CHk. The command may be an internal command, or the address may be a logical address.

The buffer memory 230 may temporarily store data during operations of the memory system 1000. For example, during a program operation, the buffer memory 230 may temporarily store original program data until a program operation of the selected memory device 100 passes. The buffer memory 230 may be composed of SRAM or DRAM.

The memory interface 240 may exchange a command, an address, and data between the memory controller 1200 and the storage 2000. For example, the host interface 240 may receive a command, an address, and data from the host 2000, and the host 2000 may transfer data. The command may be an external command, or the address may be a physical address.

The control processor 200, the internal memory 210, the memory interface 220, the buffer memory 230, and the host interface 240 may communicate with each other through a bus 250.

The host 2000 may include a host processor 2100 and a storage interface 2200. The host processor 2100 and the storage interface 2200 may communicate with each other through a bus 2300.

The host processor 2100 may generate a program request for controlling a program operation of the memory system 1000, or a read request for controlling a read operation. For example, the program request may include a program external command and a physical address for transmission to the memory system 1000. For example, the read request may include a read external command and a physical address for transmission to the memory system 1000. Various operation requests, such as an erase request, and an operation of transferring firmware to the memory system 1000 may be controlled.

The storage interface 2200 may communicate with the memory system 1000 by using an interface protocol such as Peripheral Component Interconnect Express (PCIe), Advanced Technology Attachment (ATA), Serial ATA (SATA), Parallel ATA (PATA), serial attached SCSI (SAS), or Non-Volatile Memory Express (NVMe). However, the interface protocol 2200 may not be limited to the above examples and may include various interface protocols such as a Universal Serial Bus (USB), a Multi-Media Card (MMC), an Enhanced Small Disk Interface (ESDI), or Integrated Drive Electronics (IDE).

Figure 2:
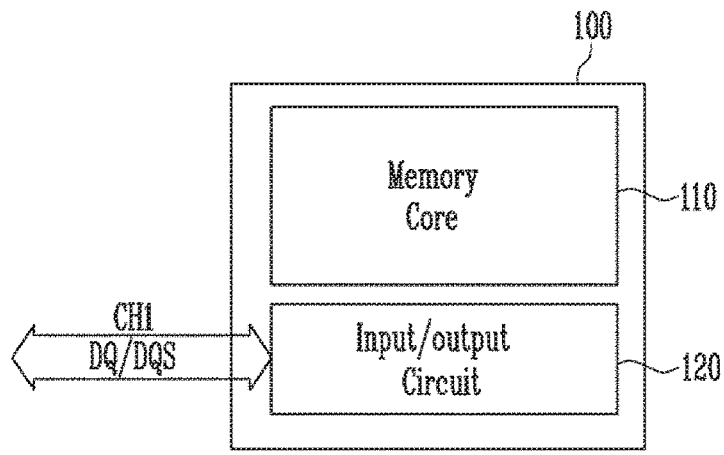
FIG. 2 is a diagram illustrating a memory device shown in FIG. 1.

FIG. 2 is a diagram illustrating the memory device 100 shown in FIG. 1.

Referring to FIG. 2, the memory device 100 may include a memory core 110 storing data and an input/output circuit 120 inputting or outputting data.

The memory core 110 may include a memory cell array storing data, a peripheral circuit configured to store data input through the input/output circuit 120 to the memory cell array, and a control logic. For example, data transferred from the memory controller 1200 as shown in FIG. 1 may be transferred to the memory core 110 through the input/output circuit 120 of the memory device 100, and the memory core 110 may program the memory cell array with the received data. In addition, the memory core 110 may output the data read from the memory cell array to the memory controller 1200 through the input/output circuit 120.

The input/output circuit 120 may be included in each of the memory devices 100. FIG. 2 illustrates one of the memory devices 100 coupled to the first channel CH1 as an example. The input/output circuit 120 may receive data transferred from the memory controller 1200 through the memory channel CH1. For example, the memory device 100 may receive data through data lines DQ and latch data in response to a strobe signal received through a data strobe line DQS. For example, the memory device 100 may latch data at a rising edge and a falling edge of a data strobe signal. Therefore, in the input/output circuit 120, the reliability of a data input/output operation may be increased when delay skew between the data line DQ and the data strobe line DQS is minimized. Hereinafter, the input/output circuit 120 that reduces the delay skew between the data line DQ and the data strobe line DQS will be described.

Figure 3:
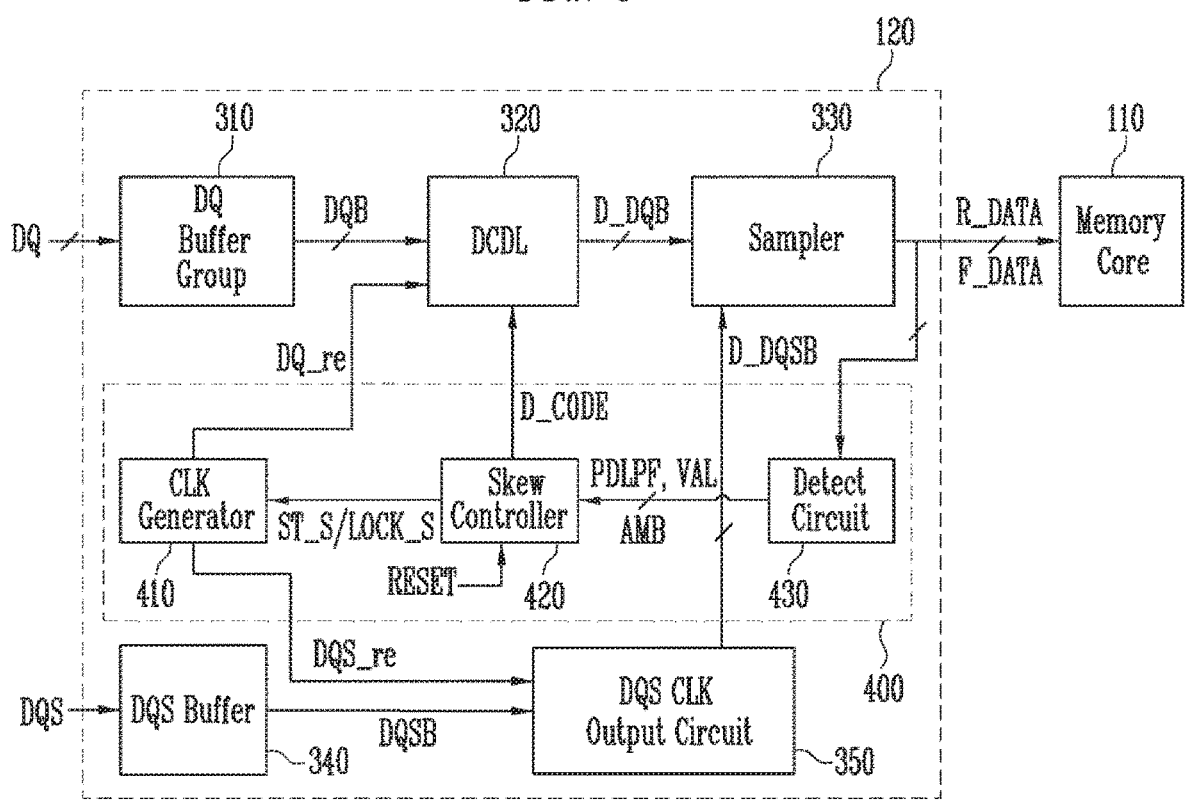
FIG. 3 is a schematic diagram illustrating an input/output circuit of FIG. 2.

FIG. 3 is a schematic diagram illustrating the input/output circuit 120 of FIG. 2.

Referring to FIG. 3, the input/output circuit 120 may include a data buffer group (referred to as DQ buffer group) 310, a digitally controlled delay line (referred to as DCDL) 320, a sampler 330, a de-skew circuit 400, a data strobe buffer (referred to as DQS buffer) 340, and a data strobe clock output circuit (referred to as DQS CLK output circuit) 350.

The DQ buffer group 310 may buffer data received through the data lines DQ and output buffered data DQB to the DCDL 320. For example, the DQ buffer group 310 may receive an original data DQ and output the buffered data DQB to the DCDL 320.

The DCDL 320 may receive the buffered data DQB from the DQ buffer group 310 and correct skew of the data DQB by controlling a delay time of the data according to a delay code D_code. The skew-corrected data by the DCDL 320 may be referred to as delay data D_DQB.

The sampler 330 may sample the delay data D_DQB in response to a delay data strobe clock D_DQSB. For example, the sampler 330 may sample the delay data D_DQB to output rising data R_DATA and falling data F_DATA.

The de-skew circuit 400 may generate a data replica clock DQ_re and a data strobe replica clock DQS_re, and may output a delay code D_CODE for skew correction according to the rising data R_DATA and the falling data F_DATA which are fed back from the sampler 330. The data replica clock DQ_re may be a replica clock of a clock used in data input lines DQ. The data strobe replica clock DQS_re may be a replica clock of a clock used in the data strobe line DQS. The data replica clock DQ_re may function as a clock of the DCDL 320. The data strobe replica clock DQS_re may be used by the DQS CLK output circuit 350. Therefore, the delay skew between the data line DQ and the data strobe line DQS may be reduced, so that the sampler 330 may output de-skewed rising data R_DATA and falling data F_DATA. To perform the above-described function, the de-skew circuit 400 may include a clock generator (referred to as CLK generator) 410, a skew controller 420, and a detect circuit 430.

The CLK generator 410 may generate various clocks. For example, the CLK generator 410 may output the replica clocks DQ_re and DQS_re to the DCDL 320 and the DQS CLK output circuit 350. In addition, the CLK generator 410 may generate and output a common clock to the skew controller 420 and the detect circuit 430.

The skew controller 420 may output a start signal ST_S to the CLK generator 410 in response to a reset signal RESET. The skew controller 420 may output the delay code D_CODE to the DCDL 320 or a lock signal LOCK_S to the CLK generator 410 in response to a code control signal PDLPF, a valid signal VAL and an ambiguous status signal AMB.

The detect circuit 430 may output the code control signal PDLPF, the valid signal VAL and the ambiguous status signal AMB in response to the data R_DATA and the F_DATA received from the sampler 330. The valid signal VAL may indicate whether the data R_DATA and F_DATA output from the sampler 330 are valid. The ambiguous status signal AMB may be output when levels of the data R_DATA and F_DATA output from the sampler 330 exceed an effective range. The code control signal PDLPF may indicate whether to vary a code upwardly or downwardly.

The DQS buffer 340 may buffer a signal received through the data strobe signal DQS and output a buffered data strobe signal DQSB to the DQS CLK output circuit 350.

The DQS CLK output circuit 350 may output the delay data strobe clock D_DQSB to the sampler 330 in response to the data strobe replica clock DQS_re and the buffered data strobe signal DQSB.

When a data path is formed through the DQ buffer group 310, the DCDL 320, and the sampler 330, and a data strobe path is formed through the DQS buffer 340 and the DQS CLK output circuit 350, the de-skew circuit 400 may function to reduce skew between the data path and the data strobe path.

The above-described input/output circuit 120 will be described in more detail.

Figure 4:
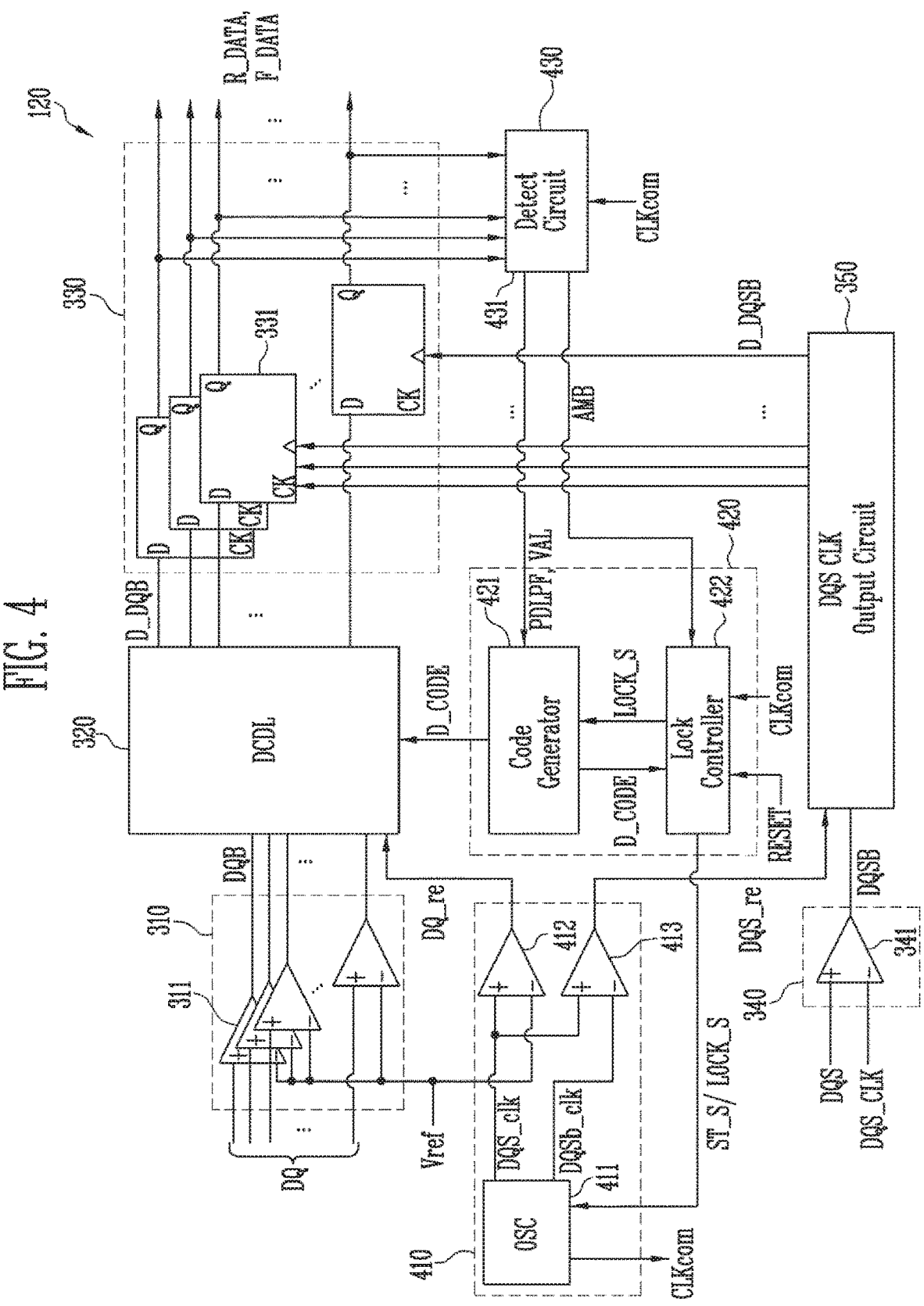
FIG. 4 is a detailed diagram illustrating an input/output circuit of FIG. 3.

FIG. 4 is a detailed diagram illustrating the input/output circuit 120 of FIG. 3.

Referring to FIG. 4, the DQ buffer group 310 may include a plurality of comparators 311. Each of the comparators 311 may commonly receive a reference voltage Vref through a negative terminal (−), and a positive terminal (+) thereof may be coupled to each of the data lines DQ. For example, the comparators 311 may compare a level of data received through the data lines DQ, respectively, with the reference voltage Vref, may buffer the data, and may output the buffered data DQB.

The DCDL 320 may receive the buffered data DQB from the DQ buffer group 310 and control a delay time of the data DQB according to the data replica clock DQ_re and the delay code D_CODE. In other words, the DCDL 320 may control an output phase of the buffered data DQB and output the delay data D_DQB in response to the delay code D_CODE which is a digital code, and may output the delay data D_DQB in response to the data replica clock DQ_re.

The sampler 330 may include a plurality of delay flip-flops (or D flip-flops) sampling the delay data D_DQB in response to the delay data strobe clock D_DQSB. The delay data D_DQB may be respectively applied to data input terminals D of the delay flip-flops 331, and the delay data strobe clock D_DQSB thereof may be applied to clock input terminals CK of the delay flip-flops 331. Therefore, each of the delay flip-flops 331 may output the falling data F_DATA and the rising data R_DATA corresponding to the delay data D_DQB in response to the delay data strobe clock D_DQSB. For example, the delay flip-flops 331 may output, in response to the delay data strobe clock D_DQSB, the rising data R_DATA of '1' when a corresponding delay data D_DQB is '1' and the falling data F_DATA of '0' when a corresponding delay data D_DQB is '0'. Therefore, the sampler 330 may receive the delay data D_DQB and output the rising data R_DATA and the falling data F_DATA in response to the delay data strobe clock D_DQSB.

The DQS buffer 340 may include a comparator 341. The comparator 341 may output the delay data strobe signal DQSB in response to a data strobe clock DQS_CLK and the data strobe signal DQS. For example, the data strobe clock DQS_CLK may be applied to a negative terminal (−) of the comparator 341 and the data strobe signal DQSB may be applied to a positive terminal (+) of the comparator 341.

The DQS CLK output circuit 350 may output the delay data strobe clock D_DQSB to the sampler 330 in response to the buffered data strobe signal DQSB received from the DQS buffer 340 and the data strobe replica clock DQS_re received from the CLK generator 410.

The de-skew circuit 400 including the CLK generator 410, the skew controller 420 and the detect circuit 430 may receive the rising data R_DATA and the falling data F_DATA output from the sampler 330 as feedback, and may control the delay data strobe clock D_DQSB and the delay code D_CODE according to the fed-back data R_DATA and F_DATA. The respective circuits are described below in more detail.

The CLK generator 410 may include an oscillator (referred to as OSC) 411, a first clock buffer 412, and a second clock buffer 413.

The OSC 411 may generate a data strobe clock DQS_clk, a data strobe inversion clock DQSb_clk and a common clock CLKcom in response to the start signal ST_S, and may stop generating the data strobe clock DQS_clk and the data strobe inversion clock DQSb_clk in response to the lock signal LOCK_S.

The first clock buffer 412 may output the data replica clock DQ_re by comparing the reference voltage Vref with the data strobe clock DQS_clk. For example, the reference voltage Vref may be applied to a negative terminal (−) of the first clock buffer 412, and the data strobe clock DQS_clk may be applied to a positive terminal (+) of the first clock buffer 412. The data replica clock DQ_re output from the first clock buffer 412 may be used to operate the DCDL 320.

The second clock buffer 413 may output the data strobe replica clock DQS_re by comparing the data strobe clock DQS_clk with the data strobe inversion clock DQS_clk. For example, the data strobe inversion clock DQSb_clk may be applied to a negative terminal (−) of the second clock buffer 413, and the data strobe clock DQS_clk may be applied to a positive terminal (+) of the second clock buffer 413. The data strobe replica clock DQS_re output from the second clock buffer 413 may be used to operate the DQS CLK output circuit 350.

The first and second clock buffers 412 and 413 may output the replica clocks DQ_re and DQS_re on the basis of the data strobe clock DQS_clk generated from the oscillator 411, so that skew between the DCDL 320 which corresponds to a data path and the DQS CLK output circuit 350 which corresponds to a data strobe path may be reduced.

The skew controller 420 may include a code generator 421 and a lock controller 422 for outputting the start signal ST_S, the delay code D_CODE, and the lock signal LOCK_S in response to the reset signal RESET, the code control signal PDLPF, the valid signal VAL, the ambiguous status signal AMB, and the common clock CLKcom.

The code generator 421 may output the delay code D_CODE to the DCDL 320 and the lock controller 422 in response to the code control signal PDLPF and the valid signal VAL, and may stop outputting the delay code D_CODE in response to the lock signal LOCK_S. For example, the code generator 421 may output the delay code D_CODE in response to the code control signal PDLPF when the valid signal VAL is applied. The delay code D_CODE may be controlled to change upwardly or downwardly according to the code control signal PDLPF.

For example, the delay code D_CODE may be generated on the basis of a default code. When the code control signal PDLPF is an up signal, the default code may be compensated to change upwardly and output as the delay code D_CODE. When the code control signal PDLPF is a down signal, the default code may be compensated to change downwardly and output as the delay code D_CODE.

For example, when the default code is assumed as '0100', the delay code D_CODE which is the up-compensated default code may be varied in a sequential manner from '0101' to '1111' according to a feedback loop. In contrast thereto, the delay code D_CODE which is the down-compensated default code may be varied in a sequential manner from '0011' to '0000' according to a feedback loop. The feedback loop may be a loop by which the rising data R_DATA and the falling data F_DATA output from the sampler 330 may be fed back to the detect circuit 430. In other words, the detect circuit 430 may update and output at least one of the code control signal PDLPF, the valid signal VAL and the ambiguous status signal AMB.

The lock controller 422 may output the start signal ST_S in response to the reset signal RESET and output the lock signal LOCK_S in response to the common clock CLKcom, the delay code D_CODE, and the ambiguous status signal AMB.

The detect circuit 430 may receive the rising data R_DATA and the falling data F_DATA output from the sampler 330 as feedback data, and may output the code control signal PDLPF, the valid signal VAL and the ambiguous status signal AMB by determining whether the rising data R_DATA and the falling data F_DATA are valid. The code control signal PDLPF may determine whether to vary the delay code D_CODE upwardly or downwardly, and the valid signal VAL may be output when the order of the rising data R_DATA and the falling data F_DATA is clear. For example, the valid signal VAL may be output when phases of the received data coincide with each other. The ambiguous status signal AMB may be output when the rising data R_DATA and the falling data F_DATA exceed an effective range. For example, when the ambiguous status signal AMB may be output when a level of the rising data R_DATA is higher than an effective rising level or when a level of the falling data F_DATA is lower than an effective falling level.

Figure 5:
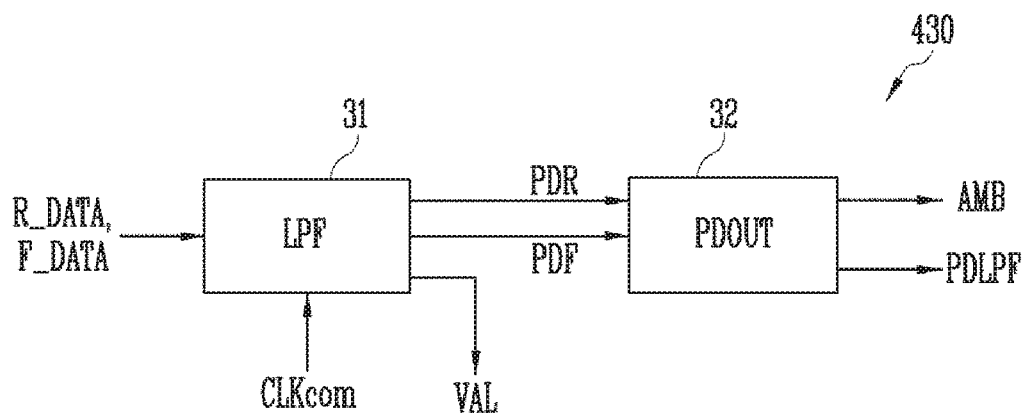
FIG. 5 is a detailed diagram illustrating a detect circuit of FIG. 4.

FIG. 5 is a detailed diagram illustrating the detect circuit 430 of FIG. 4.

Referring to FIG. 5, the detect circuit 430 may include a loop filter (referred to as LPF) 31 and a phase output circuit (referred to as PDOUT) 32.

The LPF 31 may determine whether the rising data R_DATA and the falling data F_DATA are valid or not in response to the common clock CLKcom. More specifically, the LPF 31 may receive the rising data R_DATA and the falling data F_DATA in response to the common clock CLKcom a predetermined number of times, and may output the valid signal VAL when the received data coincide with each other. For example, the LPF 31 may sample the rising data R_DATA and the falling data F_DATA three times and may output the valid signal VAL when the sampled data coincide with each other. The sampling number may vary depending on a memory system. The LPF 31 may output a phase-up signal PDR or a phase-down signal PDF according to the sampling result.

The PDOUT 32 may output the code control signal PDLPF or the ambiguous status signal AMB in response to the phase-up signal PDR and the phase-down signal PDF.

For example, when the PDOUT 32 receives the phase-up signal PDR, the PDOUT 32 may output the code control signal PDLPF to vary the default code upwardly, and when the PDOUT 32 receives the phase-down signal PDF, the PDOUT 32 may output the code control signal PDLPF to vary the default code downwardly. In addition, the PDOUT 32 may output the ambiguous status signal AMB when the phase-up signal PDR and the phase-down signal PDF exceed an effective range.

Figure 6:
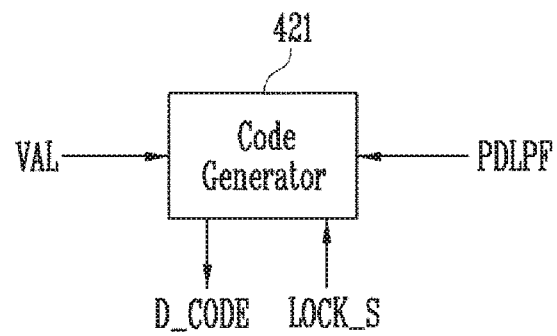
FIG. 6 is a detailed diagram illustrating a code generator of FIG. 4.

FIG. 6 is a detailed diagram illustrating the code generator 421 of FIG. 4.

Referring to FIG. 6, when the valid signal VAL is applied and the code control signal PDLPF is received, the code generator 421 may output the delay code D_CODE by varying the default code upwardly or downwardly according to the code control signal PDLPF.

Figure 7:
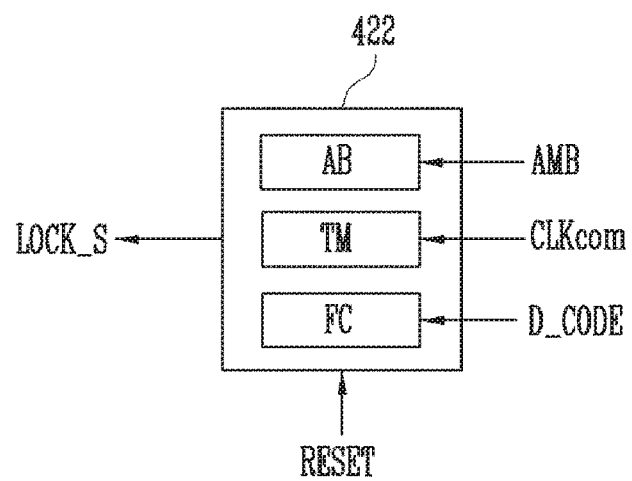
FIG. 7 is a detailed diagram illustrating a lock controller of FIG. 4.
Figure 8:
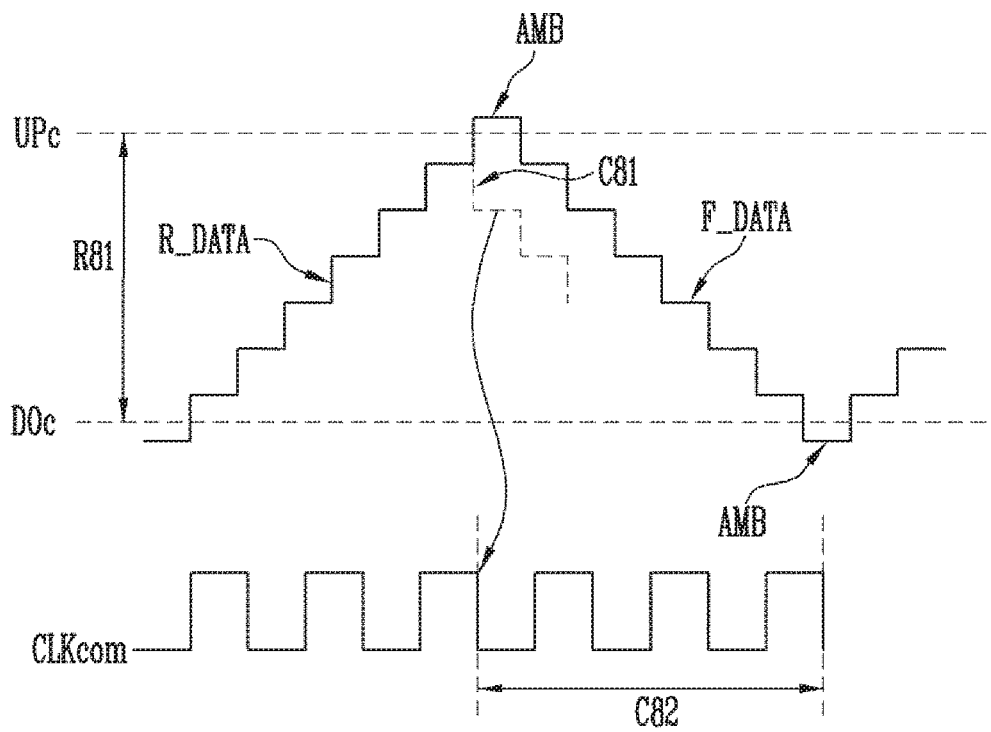
FIG. 8 is a diagram illustrating a case in which a lock signal is output.

FIG. 7 is a detailed diagram illustrating the lock controller 422 of FIG. 4, and FIG. 8 is a diagram illustrating a case in which the lock signal LOCK_S is output.

Referring to FIGS. 7 and 8, the lock controller 422 may include an ambiguous status detector AB, a timer TM, and a full code detector FC.

The ambiguous status detector AB may output the lock signal LOCK_S when the ambiguous status signal AMB is applied. For example, since the ambiguous status signal AMB is output when a level of the data R_DATA and F_DATA output from the sampler 330 exceeds an effective range, the ambiguous status detector AB may output the lock signal LOCK_S when the ambiguous status signal AMB is applied. Referring to FIG. 8, the rising data R_DATA and the falling data F_DATA may rise or fall within an effective range R81. However, the lock signal LOCK_S may be output to lock a rising or falling operation of the data when a level of the rising data R_DATA is higher than an effective rising level UPc or a level of the falling data F_DATA is lower than an effective falling level DOc.

The timer TM may output the lock signal LOCK_S when the rising data R_DATA fails to increase to the effective rising level UPc and ends up with falling, or when the falling data F_DATA fails to decrease to the effective falling level Doc and ends up with rising. For example, the timer TM may count a clock cycle C82 when the rising data R_DATA rises, and may count the clock cycle C82 when the falling data F_DATA falls on the basis of the common clock CLKcom. When the rising data R_DATA does not increase to the effective rising level UPc, a cycle of the common clock CLKcom may keep increasing. The timer TM may determine whether, with respect to each of the rising and falling data R_DATA and F_DATA, a counting number of the common clock CLKcom exceeds the clock cycle C82. The timer TM may output the lock signal LOCK_S when the counting number exceeds the clock cycle C82.

The full code detector FC may output the lock signal LOCK_S when the delay code D_CODE exceeds a predetermined correction range. For example, the delay code D_CODE may include bits for skew correction according to the code control signal PDLPF in order to correct skew. When a code exceeding the predetermined correction range is generated, the full code detector FC may output the lock signal LOCK_S.

Figure 9:
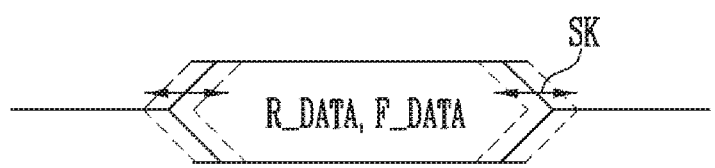
FIG. 9 is a diagram illustrating the effects of the present invention.

FIG. 9 is a diagram illustrating the effects of the present invention.

Referring to FIG. 9, the de-skew circuit 400 of FIG. 4 may detect skew SK of the rising data R_DATA and the falling data F_DATA output according to data received through the data lines DQ and the data strobe line DQS, and may output the delay code D_CODE to eliminate the skew SK, thereby performing a de-skew operation. Accordingly, reliability of the input/output data may be improved, so that reliability of the memory system may also be improved.

Figure 10:
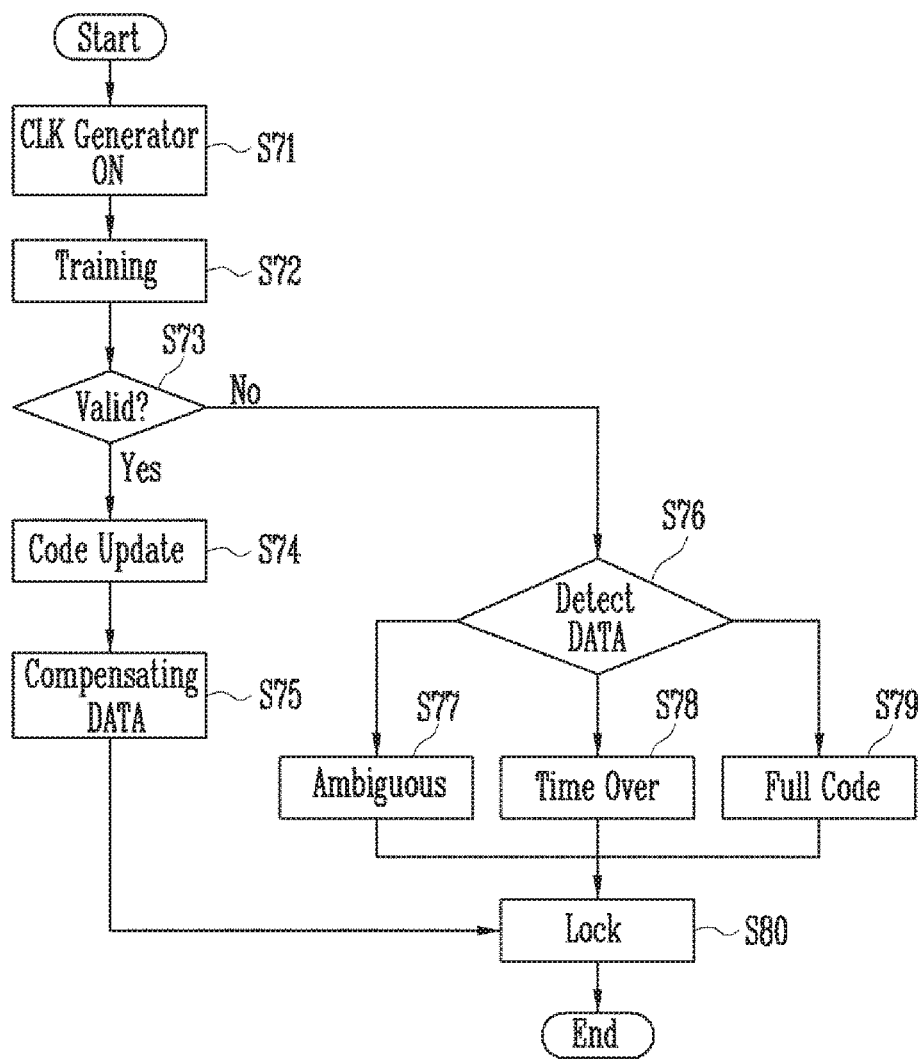
FIG. 10 is a flowchart describing a method of operating a memory device according to an embodiment.

FIG. 10 is a flowchart describing a method of operating the memory device 100 according to an embodiment. Operations will be described in detail with reference to FIGS. 4 to 10.

Referring to FIGS. 4 to 10, the CLK generator 410 may be activated in response to the start signal ST_S to thereby generate the data strobe clock DQS_clk and the common clock CLKcom at step S71.

When the data strobe clock DQS_clk and the common clock CLKcom are generated, the replica clocks DQ_re and DQS_re may be generated, and a training operation using the replica clocks DQ_re and DQS_re may be performed at step S72. During the training operation, the sampler 330 may output the rising data R_DATA and the falling data F_DATA, and the output rising and falling data R_DATA and F_DATA may be sampled by the LPF 31. The term "sampling" may refer to an operation of the LPF 31 of sampling the rising data R_DATA and the falling data F_DATA according to the common clock CLKcom.

It may be determined whether the sampled rising and falling data R_DATA and F_DATA are valid data or ambiguous data at step S73.

When the rising data R_DATA and the falling data F_DATA are valid ("Yes" at step S73), the skew controller 420 of FIG. 4 may update the delay code D_CODE to adjust skew at step S74.

Subsequently, the data may be corrected according to the updated delay code D_CODE at step S75. For example, the skew of the data may be eliminated according to the updated delay code D_CODE. When the skew of the data is eliminated, the de-skew operation may be locked at step S80.

At step S73, when the sampled rising and falling data R_DATA and F_DATA are not valid ("No" at step S73), the detected rising and falling data R_DATA and F_DATA may be detected at step S76, and when the detected rising and falling data R_DATA and F_DATA are ambiguous at step S77, the rising and falling data R_DATA and F_DATA do not reach an effective level at step S78, or the delay code D_CODE exceeds a limited correction range at step S79, the de-skew operation may be locked at step S80.

Figure 11:
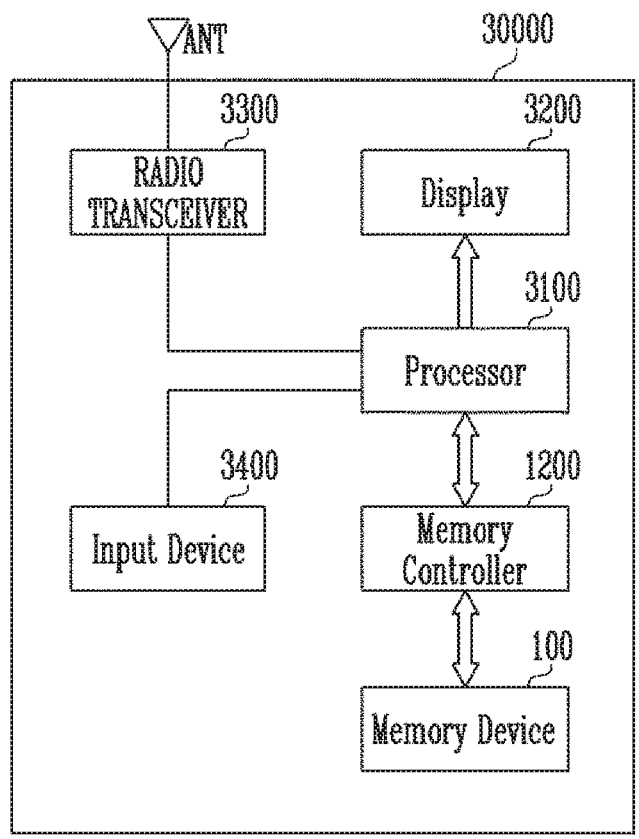
FIG. 11 is a diagram illustrating another embodiment of a memory system including a memory device shown in FIG. 2.

FIG. 11 is a diagram illustrating an embodiment of a memory system 30000 including a memory device shown in FIG. 2.

Referring to FIG. 11, a memory system 30000 may be embodied into a cellular phone, a smart phone, a tablet PC, a personal digital assistant (PDA), or a wireless communication device. The memory system 30000 may include the memory device 100 and the memory controller 1200 controlling the operations of the memory device 100. The memory controller 1200 may control a data access operation of the memory device 100, for example, a program operation, an erase operation or a read operation of the memory device 100 in response to control of a processor 3100. As described above, during a read operation of the memory controller 1200, since data received from the memory device 100 may be directly output to the processor 3100 without passing through the buffer memory, a read operation time may be reduced.

The memory controller 1200 may control data programmed into the memory device 100 to be output through a display 3200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the semiconductor memory device 100. In addition, the radio transceiver 3300 may change a signal output from the processor 3100 into a radio signal, and output the radio signal to an external device through the antenna ANT. A control signal for controlling the operations of the processor 3100 or data to be processed by the processor 3100 may be input by the input device 3400, and the input device 3400 may include a pointing device, such as a touch pad and a computer mouse, a keypad, or a keyboard. The processor 3100 may control the operations of the display 3200 so that data output from the memory controller 1200, data output from the radio transceiver 3300, or data output from an input device 3400 may be output through the display 3200.

According to an embodiment, the memory controller 1200 controlling the operations of the memory device 100 may form part of the processor 3100, or be formed as a separate chip from the processor 3100.

Figure 12:
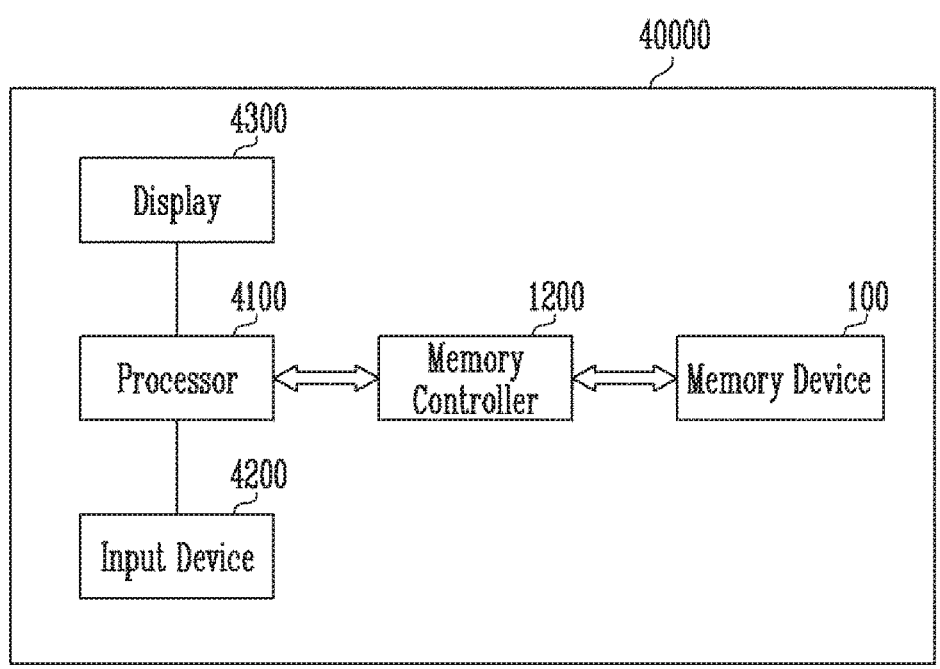
FIG. 12 is a diagram illustrating an embodiment of a memory system including a memory device shown in FIG. 2.

FIG. 12 is a diagram illustrating an embodiment of a memory system including a memory device shown in FIG. 2.

Referring to FIG. 12, a memory system 40000 may be provided as a personal computer (PC), a tablet PC, a net-book, an e-reader, a personal digital assistant (PDA), a portable multimedia player (PMP), an MP3 player, or an MP4 player.

The memory system 40000 may include the memory device 100 and the memory controller 1200 controlling a data processing operation of the memory device 100.

A processor 4100 may output data stored in the memory device 100 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 1200. According to an embodiment, the memory controller 1200 controlling the operations of the memory device 100 may be part of the processor 4100, or be formed as a separate chip from the processor 4100.

Particularly, the memory controller 1200 may skip an operation of storing read operation in a buffer memory during a read operation and directly output the read data to the processor 4100, so that a read operation time may be reduced.

Figure 13:
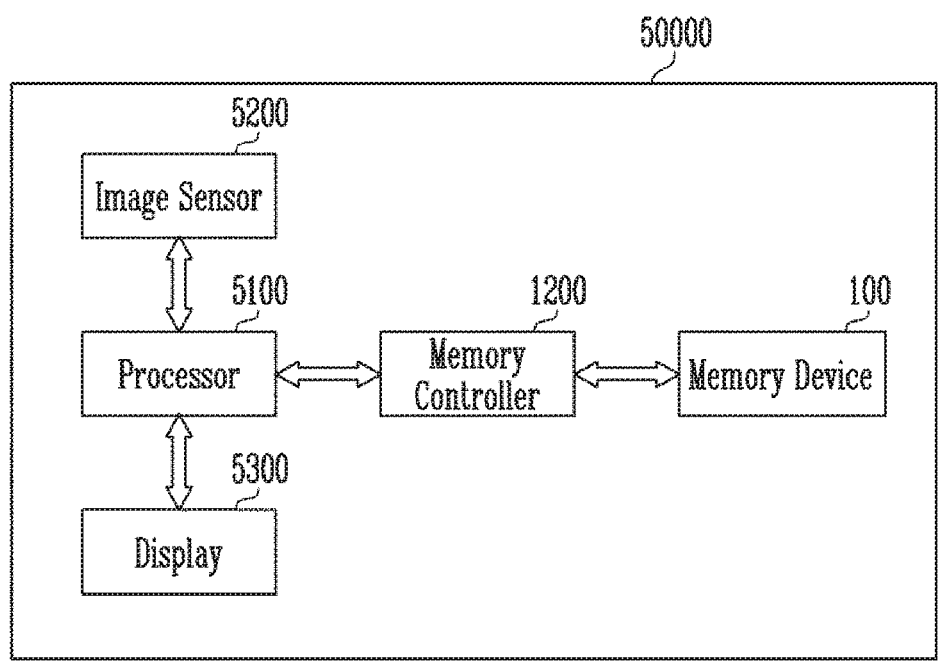
FIG. 13 is a diagram illustrating an embodiment of a memory system including a memory device shown in FIG. 2.

FIG. 13 is a diagram illustrating an embodiment of a memory system including a memory device shown in FIG. 2.

Referring to FIG. 13, a memory system 50000 may be provided as an image processing device, for example, a digital camera, a mobile phone attached with a digital camera, a smart phone attached with a digital camera, or a tablet PC attached with a digital camera.

The memory system 50000 may include the memory device 100 and the memory controller 1200 controlling a data processing operation of the memory device 100, for example, a program operation, an erase operation or a read operation.

An image sensor 5200 of the memory system 50000 may convert an optical image into digital signals, and the converted digital signals may be transferred to the processor 5100 or the memory controller 1200. In response to control of the processor 5100, the converted digital signals may be output through the display 5300 or stored in the memory device 100 through the memory controller 1200. In addition, the data stored in the memory device 100 may be output through the display 5300 according to control of the processor 5100 or the memory controller 1200.

According to an embodiment, the memory controller 1200 controlling the operations of the memory device 100 may be part of the processor 5100, or be formed as a separate chip from the processor 5100.

Particularly, the memory controller 1200 may skip an operation of storing read data in a buffer memory during a read operation and may directly output the read data to the processor 5100, so that a read operation time may be reduced.

Figure 14:
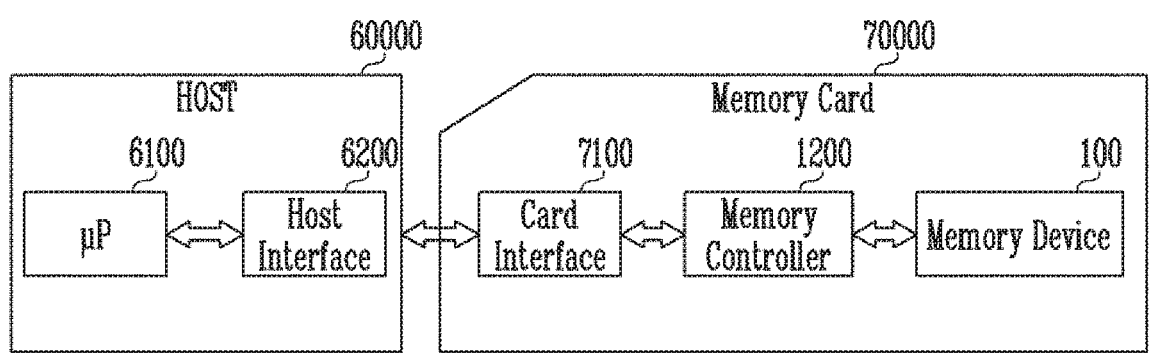
FIG. 14 is a diagram illustrating an embodiment of a memory system including a memory device shown in FIG. 2.

FIG. 14 is a diagram illustrating an embodiment of a memory system including a memory device shown in FIG. 2.

Referring to FIG. 14, a memory system 70000 may include a memory card or a smart card. The memory system 70000 may include the memory device 100, the memory controller 1200 and a card interface 7100.

The memory controller 1200 may control data exchange between the memory device 100 and the card interface 7100. According to embodiment, the card interface 7100 may be, but not limited to, a secure digital (SD) card interface or a multi-media card (MMC) interface. Particularly, the memory controller 1200 may skip an operation of storing read data in a buffer memory during a read operation and may directly output the read data to the processor 7100, so that a read operation time may be reduced.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface 7100 may refer to hardware that supports a protocol used by the host 60000, software mounted on the hardware, or a signal transmission method.

When the memory system 70000 is connected to an host interface 6200 of the host 60000 such as a PC, a tablet PC, a digital camera, a digital audio player, a cellular phone, console video game hardware, or a digital set-top pox, the host interface 6200 may perform data communication with the memory device 100 through the card interface 7100 and the memory controller 1200 in response to control of the microprocessor 6100.

According to the present disclosure, reliability of input/output data of a memory device may be improved, so that reliability of a memory system including the memory device may be improved.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

What is claimed is:

1. An input/output circuit, comprising:
 a data buffer group configured to buffer data received through data lines;

a data strobe buffer configured to buffer a data strobe signal to output a buffered data strobe clock;

a digitally controlled delay line configured to output delay data by controlling skew of the buffered data according to a delay code;

a data strobe clock output circuit configured to generate a delay data strobe clock in response to the buffered data strobe clock;

a sampler configured to sample the delay data according to the delay data strobe clock to output sampled data; and a de-skew circuit configured to generate a valid signal based on whether phases of the sampled data coincide with each other, and to update the delay code according to the valid signal.

2. The input/output circuit of claim 1, wherein the data buffer group comprises a plurality of comparators configured to buffer the data received through the data lines.

3. The input/output circuit of claim 2, wherein each of the comparators commonly receives a reference voltage through a negative terminal thereof, receives the data through a positive terminal thereof, and outputs the buffered data by comparing levels of the reference voltage and the data.

4. The input/output circuit of claim 1, wherein the data strobe buffer comprises a comparator configured to receive the data strobe clock at its negative terminal and the data strobe signal at its positive terminal, and wherein the comparator outputs the buffered data strobe clock in response to the data strobe clock and the data strobe signal.

5. The input/output circuit of claim 1, wherein the digitally controlled delay line controls a phase of the buffered data according to the delay code to output the delay data.

6. The input/output circuit of claim 1, wherein the sampler includes a plurality of delay flip-flop configured to sample the delay data according to the delay data strobe clock to output rising data and falling data as the sampled data.

7. The input/output circuit of claim 1, wherein the de-skew circuit comprises:

a clock generator configured to generate a data replica clock for driving the digitally controlled delay line and a data strobe replica clock for driving the data strobe clock output circuit;

a detect circuit configured to output a code control signal for updating the delay code upwardly or downwardly according to the sampled data, or to output the valid signal or an ambiguous status signal by determining validity of the sampled data; and a skew controller configured to update the delay code in response to the valid signal and the code control signal, and to output a lock signal in response to the ambiguous status signal.

8. The input/output circuit of claim 7, wherein the clock generator comprises:

an oscillator configured to generate the data strobe clock and stop generating the data strobe clock in response to the lock signal;

a first clock buffer configured to output the data replica clock according to a reference voltage and the data strobe clock; and a second clock buffer configured to output the data strobe replica clock according to the data strobe clock and a data strobe inversion clock.

9. The input/output circuit of claim 8, wherein the data replica clock is used to drive the digitally controlled delay line, and the data strobe replica clock is used to drive the data strobe clock output circuit.

10. The input/output circuit of claim 7, wherein the clock generator comprises:

an oscillator configured to generate the data strobe clock and a common clock;

a first comparator configured to compare the data strobe clock with a reference voltage to output the data replica clock; and a second comparator configured to compare the data strobe clock with a data strobe inversion clock to output the data strobe replica clock.

11. The input/output circuit of claim 7, wherein the detect circuit comprises:

a loop filter configured to output the valid signal according to the sampled data, and to output a phase-up signal or a phase-down signal according to the sampled data; and a phase output circuit configured to output a code control signal for determining the delay code to change upwardly or downwardly in response to the phase-up signal or the phase-down signal, or to output the ambiguous status signal when a level of the sampled data exceeds an effective range.

12. The input/output circuit of claim 11, wherein the phase output circuit outputs the code control signal for changing the delay code upwardly when receiving the phase-up signal, and the phase output circuit outputs the code control signal for changing the delay code downwardly when receiving the phase-down signal.

13. The input/output circuit of claim 7, wherein the skew controller comprises:

a code generator configured to generate the delay code in response to the valid signal and the code control signal and to stop generation of the delay code in response to the lock signal; and a lock controller configured to output the lock signal in response to the ambiguous status signal and the delay code.

14. The input/output circuit of claim 13, wherein the code generator generates the delay code by varying a default code upwardly or downwardly in response to the valid signal.

15. The input/output circuit of claim 13, wherein the lock controller comprises:

an ambiguous status detector configured to output the lock signal when receiving the ambiguous status signal;

a timer configured to output the lock signal when the sampled data does not reach an effective range; and a full code detector configured to output the lock signal when the delay code exceeds an effective correction range.

16. An input/output circuit, comprising:

a data path configured to transfer data;

a data strobe path configured to transfer a data strobe signal; and a de-skew circuit configured to reduce skew between rising data and falling data output through the data path by feeding back the rising and falling data output through the data path and by controlling a delay time of the data path and the data strobe path.

17. The input/output circuit of claim 16, wherein the data path comprises:

a data buffer group configured to buffer the data received through data lines;

a digitally controlled delay line configured to output delay data by controlling skew of the buffered data; and a sampler configured to sample the delay data according to a delay data strobe clock to output the rising data and the falling data.

18. The input/output circuit of claim 17, wherein the data strobe path comprises:
- a data strobe buffer configured to buffer the data strobe signal; and
- a data strobe clock output circuit configured to generate a delay data strobe clock in response to the buffered data strobe signal.

19. The input/output circuit of claim 18, wherein the de-skew circuit comprises:
- a clock generator configured to output clocks to the digitally controlled delay line and the data strobe clock output circuit;
- a detect circuit configured to determine validity of the rising data and the falling data and to output a code control signal for determining whether to change a phase of the delay data; and
- a skew controller configured to output a lock signal in response to an ambiguous status signal received from the detect circuit and to update the delay code in response to the code control signal.

20. The input/output circuit of claim 19, wherein the skew controller comprises:
- a code generator configured to generate the delay code in response to the code control signal; and
- a lock controller configured to output the lock signal in response to the ambiguous status signal.

* * * * *